United States Patent
Onishi et al.

(10) Patent No.: US 8,555,695 B2
(45) Date of Patent: Oct. 15, 2013

(54) CURRENT COLLECTOR SHAPE ADJUSTING DEVICE

(75) Inventors: Masato Onishi, Toyohashi (JP); Shinichi Sakai, Toyohashi (JP); Masaru Doutai, Kosai (JP); Masaru Kobayashi, Toyohashi (JP); Hiroaki Arai, Hamamatsu (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 0 days.

(21) Appl. No.: 13/492,236

(22) Filed: Jun. 8, 2012

(65) Prior Publication Data

US 2012/0240654 A1    Sep. 27, 2012

Related U.S. Application Data

(62) Division of application No. 11/954,900, filed on Dec. 12, 2007, now Pat. No. 8,217,658.

(30) Foreign Application Priority Data

Dec. 28, 2006 (JP) ................................. 2006-354357
Oct. 22, 2007 (JP) ................................. 2007-274509

(51) Int. Cl.
*B21D 3/16* (2006.01)
(52) U.S. Cl.
USPC .............. 72/401; 29/623.1; 29/560.1; 72/397
(58) Field of Classification Search
USPC ................. 29/560.1, 623, 623.1; 72/397, 401
See application file for complete search history.

(56) References Cited

U.S. PATENT DOCUMENTS

| 4,569,511 A * | 2/1986 | Bell, Jr. .................. 269/276 |
| 2001/0019270 A1 | 9/2001 | Onishi et al. |
| 2005/0253591 A1 | 11/2005 | Kasamatsu et al. |
| 2006/0108729 A1 * | 5/2006 | Siegel .................. 269/266 |
| 2006/0204836 A1 | 9/2006 | Kaito et al. |
| 2007/0212601 A1 | 9/2007 | Sakamoto et al. |

FOREIGN PATENT DOCUMENTS

| JP | 08-045500 | 2/1996 |
| JP | 2001-236985 | 8/2001 |
| JP | 2002-093410 | 3/2002 |
| JP | 2007-035306 | 2/2007 |

* cited by examiner

*Primary Examiner* — Ula C Ruddock
*Assistant Examiner* — Frank Chernow
(74) *Attorney, Agent, or Firm* — Oblon, Spivak, McClelland, Maier & Neustadt, L.L.P.

(57) ABSTRACT

A battery unit is housed in a metallic battery case. In the battery unit, current collectors having bent portions on both sides are fixed to face surfaces of an electrode plate group of a prismatic battery. The portions of the battery case, which correspond to the bent portions, are pressed in a thickness direction. Under the pressure, a short circuit inspection for a short circuit between the battery case and the current collectors of the battery unit is executed. When a projected object exists on the bent portion, a short circuit is generated between the battery case and the current collector by pressing so that a short circuit failure caused by a shape of the current collector can be detected.

1 Claim, 13 Drawing Sheets

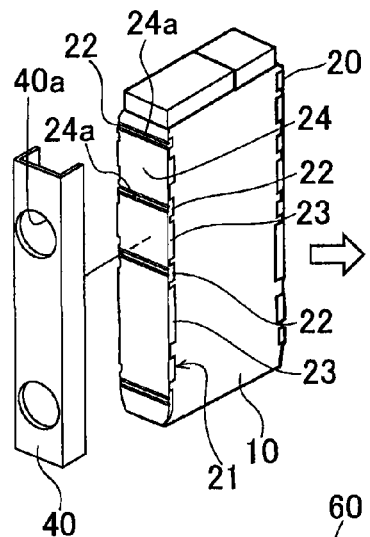
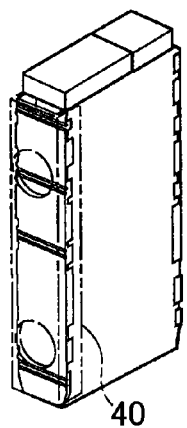
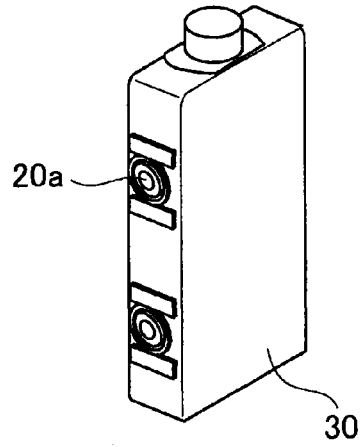
FIG. 1A  FIG. 1B  FIG. 1C
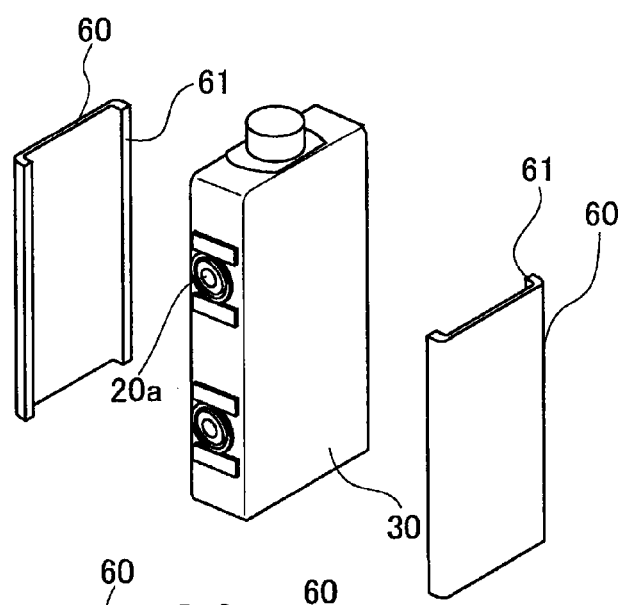
FIG. 1D
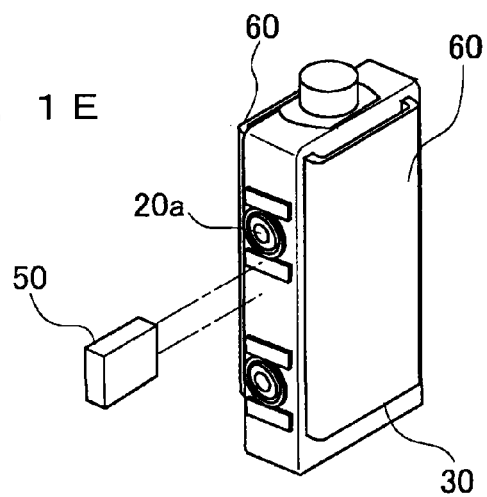
FIG. 1E

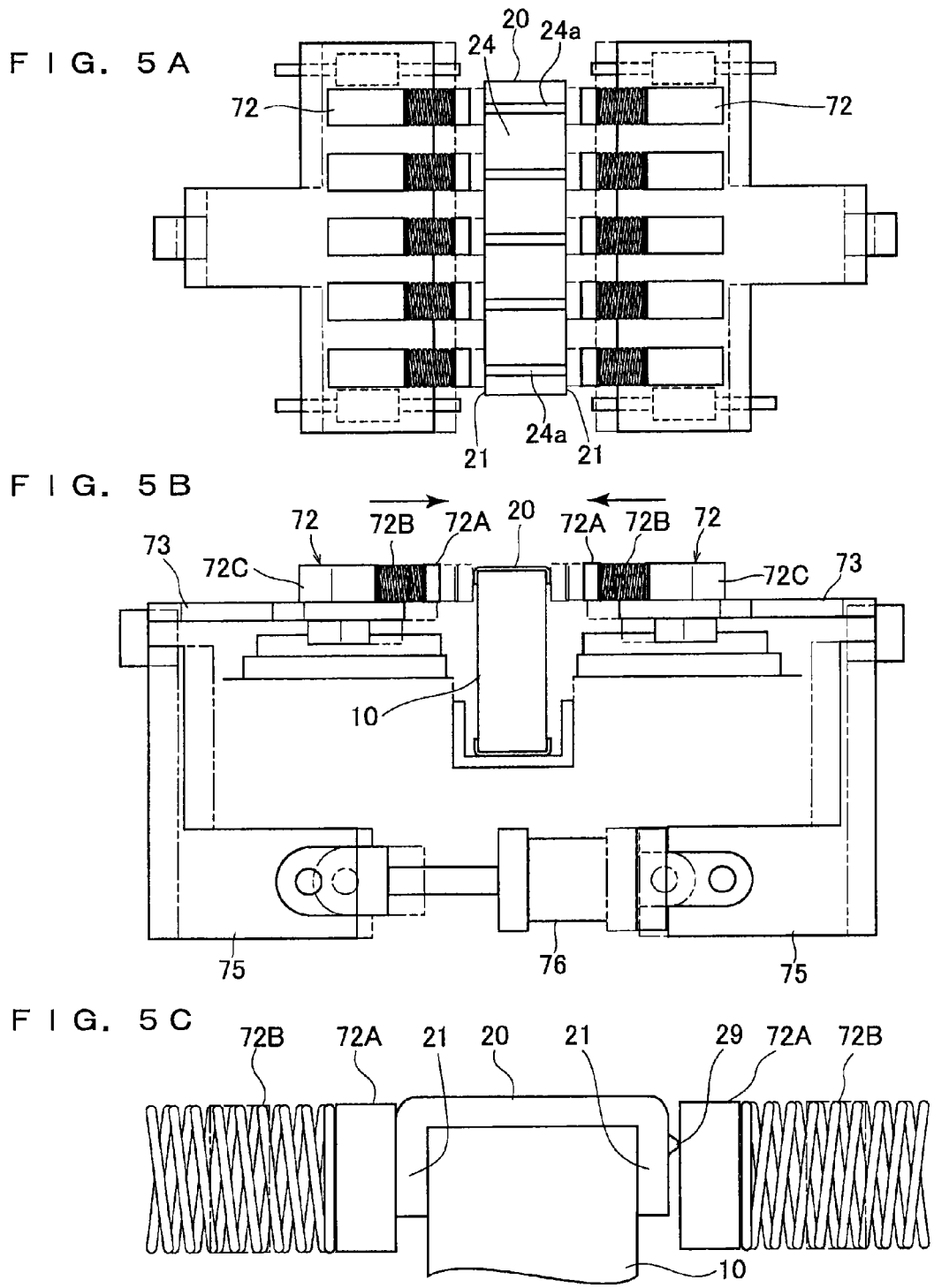

DIFFERENCE

DIFFERENCE

CURRENT COLLECTOR SHAPE ADJUSTING DEVICE

CROSS-REFERENCE TO RELATED APPLICATIONS

This application is a divisional of U.S. application Ser. No. 11/954,900, filed Dec. 12, 2007, and is based upon and claims the benefit of priority from prior Japanese Patent Application Nos. 2006-354357, filed Dec. 28, 2006 and 2007-274509, filed Oct. 22, 2007. The entire contents of each of these documents are incorporated herein by reference.

BACKGROUND OF THE INVENTION

1. Field of the Invention

The present invention relates to a short circuit inspection method executing a short circuit inspection during a prismatic battery manufacturing procedure to detect a short circuit caused by a shape of a current collector of a prismatic battery having an electrode plate group composed of a positive electrode plate, negative electrode plate and a separator, a prismatic battery manufacturing method including the short circuit inspection step, and a current collector shape adjusting device used in the prismatic battery manufacturing procedure to prevent a short circuit caused by a shape of the current collector.

2. Description of the Related Art

In recent years, portable information devices such as a cellular phone, note book-sized personal computer and so on have become widespread. Those devices aim for higher performance, reduced weight, and miniaturization. Accordingly, the secondary battery for use in the power supply of the portable information devices is required to have reduced size and weight and increased energy density. Further, such a secondary battery is used as a driving power source of an electric vehicle or a hybrid electric vehicle.

Such a portable information device, electric vehicle, or hybrid electric vehicle has limited space to house the secondary battery. On the other hand, the conventional secondary battery often has a cylindrical shape and thus undesirably creates a gap in the limited space so that a large space is required when it is housed.

Hence, in place of the cylindrical battery, a prismatic battery has become mainstream as a secondary battery used in the above devices or vehicles. Such a prismatic battery has an electrode plate group 10, in which side edge portions of positive electrode plates 18 and negative electrode plates 19 on the opposite sides are protruded from facing areas of the both electrode plates, as shown in FIGS. 11A and 11B, and current collectors 20 are fixed to the protruded portions (lead portions 18a, 19a) in both side areas of the electrode plate group 10. Concretely, lead portion joint surfaces 24 of the current collector 20 face the lead portions 18a, 19a, bent portions 21, 21, bent from side ends of the respective lead portion joint surfaces 24 are formed to lie over outer surfaces of the electrode plate group 10 in a stack direction of the positive electrode plates 18 and negative electrode plates 19, and at least a part of the respective lead portion joint surface 24 is welded and fixed to the lead portions 18a, 19a. Further, an outer insulating tape 16 is attached on the outer surfaces of the positive electrode plate 18 and negative electrode plate 19 between the bent portions 21, 21 to insulate from the battery case 30.

When the current collectors 20 are fixed, the electrode plate group 10 is housed in the battery case 30, as a battery unit. The size of the battery case 30 is made close to the outside dimension of the electrode plate group 10 since it influences the outside dimension of the prismatic battery.

Regarding such a prismatic battery, the electrode plate group 10 is generally inspected whether or not a short circuit is generated in the electrode plate group 10 with the current collectors 20 before the electrode plate group 10 is housed in the battery case 30, as disclosed in Patent Document 1.

[Patent Document 1] Japanese Patent Application Laid-Open No. 2001-236985

Patent Document 1 describes a technique of "A short circuit inspection method for a battery, in which an electrode plate group composed of positive electrode plates and negative electrode plates stacked via separators is inserted in a battery case, wherein a short circuit failure is inspected while applying pressure on the electrode plate group before inserting the electrode plate group into the battery case." This technique is made in view of a short circuit failure caused by a swelling in the electrode plate group 10 by charges and discharges of the secondary battery, and the short circuit inspection is executed while applying pressure on a center portion of the electrode plate group 10 in a stack direction of the positive electrode plates and the negative electrode plates to virtually create a swelling condition.

Patent Document 2 proposes a technique for reducing a thickness of a circumference of a cut electrode plate to suppress an occurrence of burrs, which cause a short circuit.

[Patent Document 2] Japanese Patent Application Laid-Open No. 8-45500

SUMMARY OF THE INVENTION

As described above, in the electrode plate group 10 for the prismatic battery, current collectors 20 are provided at both ends and lead portion joint surfaces 24 of the current collectors 20 are fixed to the lead portions 18a, 19a of the electrode plate group 10 by an electron beam welding. Generally, the lead portions 18a, 19a are welded at portions along the width direction of the current collector 20 with proper intervals in a longitudinal direction of the current collector 20 (that is, a vertical direction of the current collector 20 in FIG. 11A). Then, a current collector insulating tape 40 is attached on the bent portions 21 and the electrode plate group 10 is housed in the battery case 30.

There is no problem when the bent portions 21 of the current collector 20 are flat, as shown in FIG. 10A; however, a projected object 29 sometimes exists, as shown in FIG. 10B. The projected object 29 is, for example, a spatter attached while welding or a burr generated while cutting the current collectors 20 prior to the welding. The projected object 29 remained on the bent portion 21 of the current collector 20 can break through the current collector insulating tape 40 insulating between the battery case 30 and the bent portions 21 of the current collectors 20. This causes a short circuit between the current collector 20 and the battery case 30.

However, the technique of Patent Document 1 is a short circuit inspection by applying pressure on a center portion of the electrode plate group in a stack direction of the electrode plates and the pressure is not applied sufficiently to the bent portions of the current collectors, which are located in end portions of the electrode plate group. As a result, even when a projected portion such as a burr and a spatter exists, the current collector insulating tape is not broken by a projected portion and such an electrode plate group 10 is not detected as a short circuit failure.

On the other hand, the technique of Patent Document 2 describes a reduction of a thickness of a circumference of each electrode plate; however, it does not disclose a method for processing a projected object such as a burr or a spatter generated on a current collector to be welded to an electrode plate group. Further, since the technique is to reduce the thickness of the circumference of each electrode plate before welding, it is not effective for a matter of a spatter generated while welding.

The present invention is made in view of the above problems and has an object to provide a prismatic battery short circuit inspection method for detecting a short circuit failure caused by an existence of a projected object on a bent portion of a current collector, which is, for example, a burr while cutting a current collector, a spatter while welding the current collector to an electrode plate, or a bulge caused by a deteriorated mold. Another object of the present invention is to provide a prismatic battery manufacturing method including the short circuit inspection step, and further, a current collector shape adjusting step to reduce short circuit failures. Another object of the present invention is to provide a current collector shape adjusting device capable of preventing a short circuit caused by a shape of the current collector.

As a means for solving the above problem, the present application discloses the following invention. That is, a prismatic battery short circuit inspection method of the present invention is a method executing a short circuit inspection of a prismatic battery, the prismatic battery having a battery unit comprising:
an electrode plate group; and
current collectors having lead portion joint surfaces, which are respectively provided corresponding to lead portions of positive electrode plates and negative electrode plates in sides of the electrode plate group, face to end portions of the lead portions, and have at least a part to be welded and fixed to the lead portions, and bent portions bend from side edges of respective lead portion joint surfaces to lie over outer surfaces of the electrode plate group in a stack direction of the positive electrode plates and the negative electrode plates, and the method comprising:
pressing portions on outer faces of a battery case, which are corresponding to the bent portions facing each other in a manner of sandwiching the electrode plate group therebetween, toward the stack direction of the electrode plate group, in a condition that the battery unit is housed in the battery case; and
executing a short circuit inspection between the battery case and the current collector under the pressure.

Preferably, in the short circuit inspection, pressing plates having pressure portions corresponding to positions where the bent portions are formed are provided in both sides of the battery case in a sandwiching manner and the pressing plates are moved to be close to each other to apply pressure on the outer faces of the battery case to execute the short circuit inspection.

A prismatic battery manufacturing method of the present invention is a method manufacturing a prismatic battery, the prismatic battery having a battery unit comprising:
an electrode plate group; and
current collectors having lead portion joint surfaces, which are respectively provided corresponding to lead portions of positive electrode plates and negative electrode plates in sides of the electrode plate group, face to end portions of the lead portions, and have at least a part to be welded and fixed to the lead portions, and bent portions bend from side edges of respective lead portion joint surfaces to lie over outer surfaces of the electrode plate group in a stack direction of the positive electrode plates and the negative electrode plates, and the method comprising:
housing the battery unit in a battery case;
applying, thereafter, pressure on portions on outer faces of the battery case, corresponding to the bent portions facing each other in a manner of sandwiching the electrode plate group therebetween, in a direction of a thickness of the battery case; and
executing a short circuit inspection between the battery case and the current collector under the pressure.

Preferably, in the short circuit inspection step, pressing plates having pressure portions corresponding to positions where the bent portions are formed are provided in both sides of the battery case in a sandwiching manner and the pressing plates are moved to be close to each other to apply pressure on the outer faces of the battery case to execute the short circuit inspection.

The battery case can be a rectangular parallelepiped shape including a narrow side face and a wide side face, and the electrode plate group comprises a structure, in which a plurality of positive electrode plates and negative electrode plates are stacked with separators interposed therebetween in a manner of being substantially parallel to the wide side face of the battery case, ends of the positive electrode plates protrude outwardly from facing areas of the both electrode plates in one side of the electrode plate group, ends of the negative electrode plates protrude outwardly from the facing areas of the both electrode plates in the other side of the electrode plate group, and the protruded ends of the both electrode plates serve as the lead portions.

Preferably, the battery unit is housed in a battery case after putting a current collector insulating tape at least on the current collector which has a polarity opposite to the battery case out of the current collectors provided corresponding to each lead portion of the positive electrode plate and negative electrode plate.

The method can further have a step of applying an electrolyte into the battery case after housing the battery unit in the battery case. The method can further have a step of activating the battery after the electrolyte applying step. The method can further have a step of forming a module by assembling the battery case after housing the battery unit in the battery case and the short circuit inspection can be executed on the formed module.

Preferably, the prismatic battery manufacturing method of the present invention has a step of adjusting a shape of the bent portion of the current collector before housing the battery unit in the battery case. The shape adjusting step preferably has a step of pressing the bent portion of the current collector from both sides of the battery unit in a thickness direction to squash a projected object generated on the bent portion.

Preferably, after the shape adjusting step, the method further has steps of measuring a height of the projected object, and determining whether or not the height of the projected object obtained in the measuring step is a height within an allowable range. In the determining step, preferably, an average value of heights of projected objects is obtained and the height of the projected object to be determined is determined whether to be included within the allowable range, which is a range including the average value as a center value.

A current collector shape adjusting device of the present invention is a device adjusting current collectors of a battery unit applied to a prismatic battery, the battery unit comprising:
an electrode plate group; and
the current collectors having lead portion joint surfaces, which are respectively provided corresponding to lead portions of positive electrode plates and negative electrode plates in sides of the electrode plate group, face to end portions of the lead portions, and have at least a part to be welded and fixed to the lead portions, and bent portions bend from side edges of respective lead portion joint surfaces to lie over outer surfaces of the electrode plate group in a stack direction of the positive electrode plates and the negative electrode plates, and the current collector shape adjusting device comprising:

a work placement unit on which the battery unit is placed;

a pair of pressing pieces provided in both sides of the battery unit in a thickness direction to press and deform, in the thickness direction, the bent portions of the current collectors of the battery unit disposed on said work placement unit;

a pair of piece fixing plates fixing and supporting said respective pressing pieces; and a moving mechanism moving said pair of piece fixing plates and pressing pieces toward the battery unit placed on said work placement unit.

Preferably, each of the pressing piece has a head portion contacting with the bent portion of the current collector, a main body fixed to the piece fixing plate, and an elastic member disposed between the head portion and the main body.

EFFECT OF THE INVENTION

According to the prismatic battery short circuit inspection method and manufacturing method of the present invention, pressure is applied to the portions corresponding to the bent portions of the current collectors, which face each other as sandwiching the electrode plate group therebetween, on the outer faces of the battery case in a stack direction of the electrode plate group, in a condition that the battery unit including the electrode plate group and current collectors is housed in the battery case, and the short circuit inspection is executed under the pressure. When a projected object exists on the bent portion and pressure is applied, the projected object can break through the current collector insulating tape so that a short circuit is generated between the battery case and the current collector. Accordingly, a short circuit failure caused by a shape of the current collector can be detected.

Further, since the method includes a shape adjusting step for deforming a projected object generated on the bent portion of the current collector, an occurrence of short circuit failure can be suppressed and yield of the product can be improved.

Further, according to the current collector shape adjusting device of the present invention, since the projected object generated on the bent portion of the current collector can be deformed by pressing, an occurrence of short circuit failure can be suppressed and yield of the product can be improved when the shape of the current collector is adjusted by using the current collector shape adjusting device before housing the battery unit in the battery case.

BRIEF DESCRIPTION OF THE DRAWINGS

FIGS. 1A to 1E are views used to explain a short circuit inspection method;

FIGS. 5A to 5C are views used to explain an operation of the current collector shape adjusting device, with FIG. 5A showing a movement of a pressing piece and the like as seen from a plane direction, FIG. 5B showing the movement of the pressing piece and the like as seen from a lateral direction, and with FIG. 5C being a enlarged view of a relevant part of the pressing piece;

DETAILED DESCRIPTION OF THE PREFERRED EMBODIMENT(S)

Figure 2A:
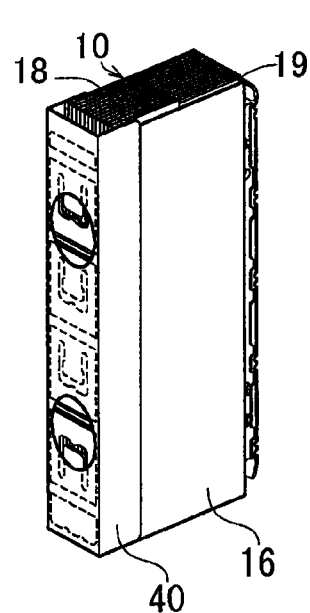
FIGS. 2A to 2C are views showing a procedure for assembling a prismatic battery, with FIG. 2A being a perspective view showing a side where a current collector insulating tape is attached, FIG. 2B being a perspective view showing a side where the current collector insulating tape is not attached, and FIG. 2C being a perspective view showing a state of a module in which three battery cases are assembled.
Figure 2B:
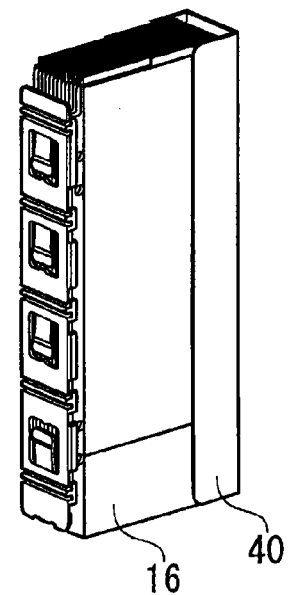
Figure 2C:
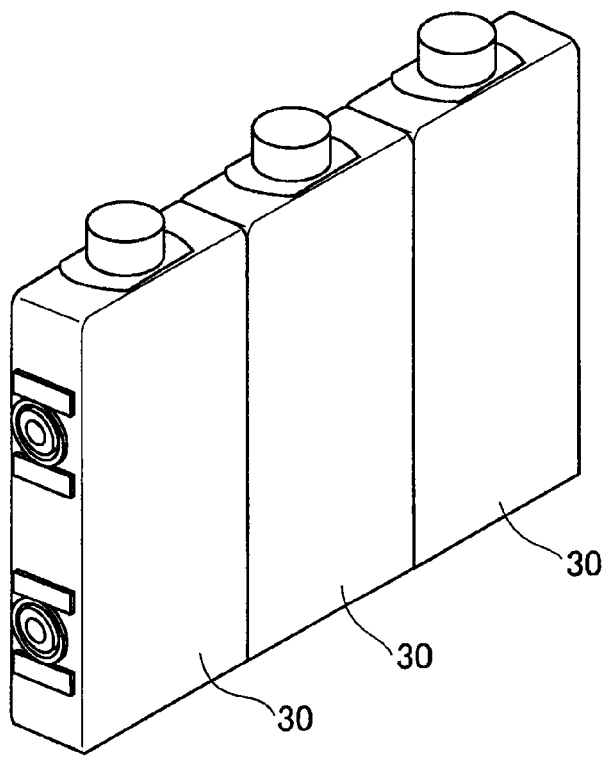
Figure 3:
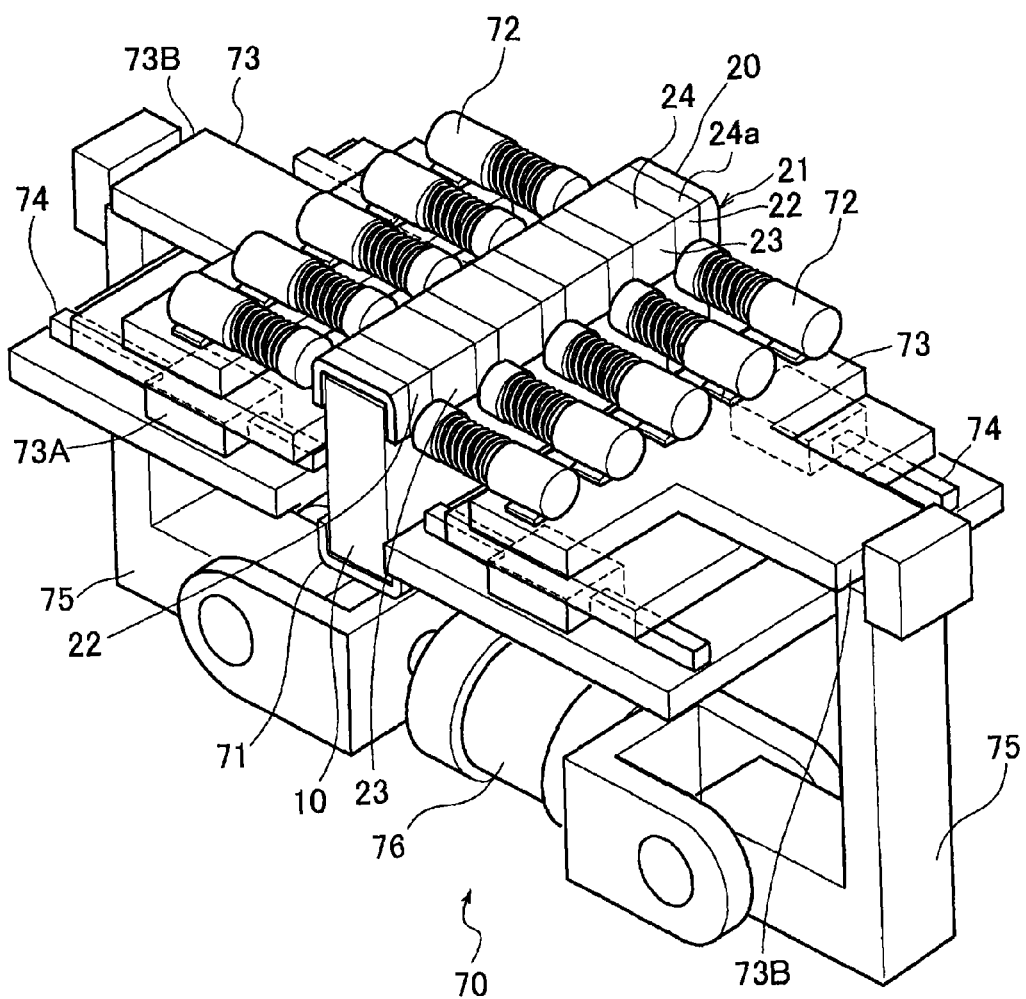
FIG. 3 is a perspective view showing a current collector shape adjusting device.

Embodiments of the present invention will be described with reference to the drawings, taking a nickel-metal hydride battery as an example. FIGS. 1A to 1E are views used to explain a short circuit inspection method and FIGS. 2A to 2C are views used to explain an assembly procedure of a prismatic battery. FIGS. 3 to 5C are views used to explain a current collector shape adjusting device for preventing a short circuit. FIGS. 6A to 8C are views used to explain a measuring device inspecting a presence of a projected object such as a burr or a spatter and a dimension measuring device provided to the measuring device. FIGS. 9A to 9C are views used to explain determining steps.

First Embodiment

As shown in FIGS. 1A and 1B, current collectors 20 (which is made of nickel-plated steel plate) are respectively provided corresponding to lead portions 18a, 19a (see FIGS. 11A and 11B), which are located in both sides of an electrode plate group 10 used for a prismatic battery in a rectangular parallelepiped shape. Each of the current collectors 20 includes a lead portion joint surface 24 facing to an end portion of the lead portion 18a, 19a of the electrode plate group 10 and bent portions 21 bent from both ends of the lead portion joint surface 24 to lie over outer surfaces facing each other in a stack direction of positive electrode plates 18 and a negative electrode plates 19 (thickness direction of the electrode plate group 10). Then, the lead portion joint surface 24 is welded to the end portion of the lead portion 18a, 19a. Here, a reference number 24a shown in FIG. 1A represents welding lines formed on the lead portion joint surface 24.

As shown in FIGS. 1B and 2A, a current collector insulating tape 40 is attached on the current collector 20 in a positive electrode side, which is welded to the lead portion of a positive electrode plate. The current collector insulating tape 40 is required to be attached at least on the current collector 20 in the positive electrode side and can also be attached on the current collector 20 in a negative electrode side.

As shown in FIGS. 1A, 1B, 2A and 2B, an outer insulating tape 16 is attached on the outer surfaces of the electrode plate group 10. Concretely, the outer insulating tape 16 is attached around to cover all over the positive electrode plate 18 and negative electrode plate 19, which are located in an outermost of the electrode plate group 10. Further, on the electrode plate group 10, to which the outer insulating tape 16 is attached, the current collector insulating tape 40 is attached at least on the current collector 20 in the positive electrode side including the bent portions 21 thereof, as described above. Here, a reference number 40a in FIG. 1A represents opening portions to expose terminal portions 20a of the current collector 20.

Figure 11A:
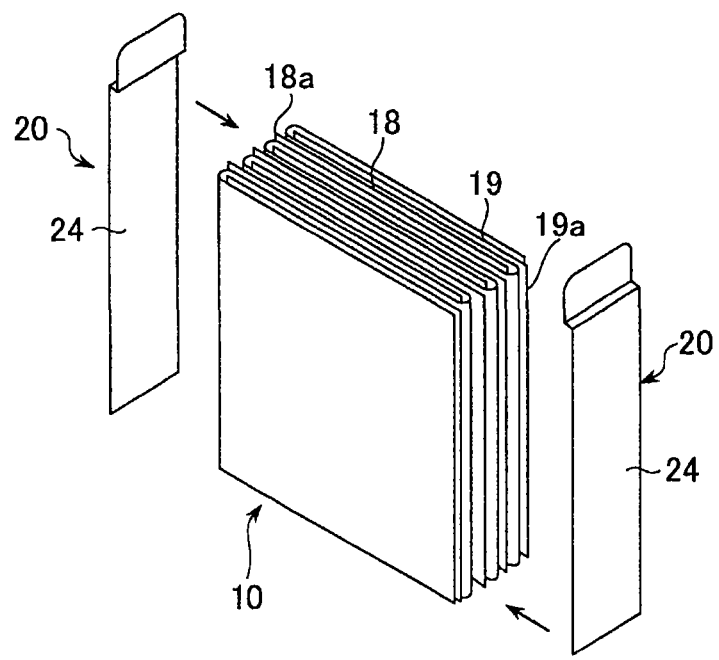
FIG. 11A is a perspective view showing a typical configuration of an electrode plate group of the prismatic battery.
Figure 11B:
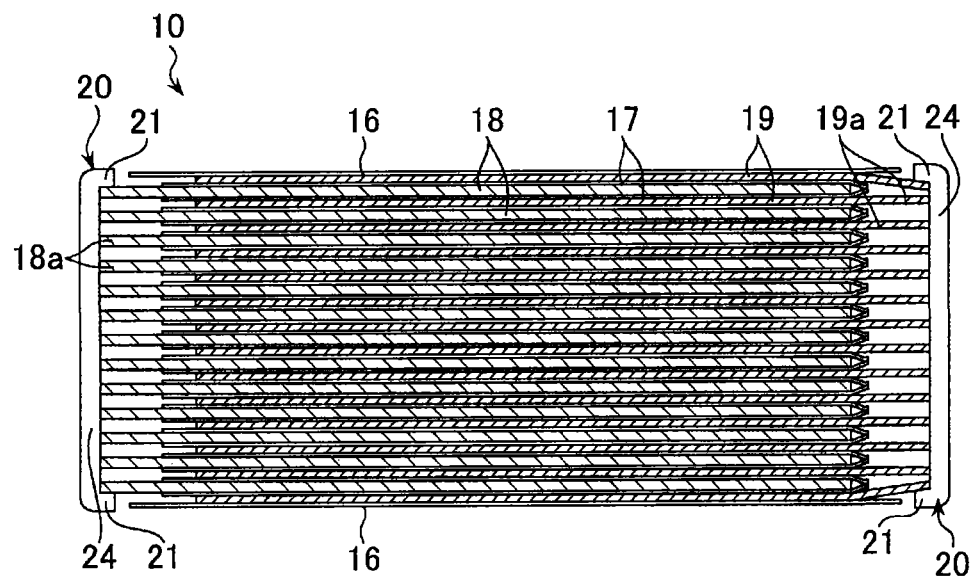
FIG. 11B is a plan view of the typical configuration of the electrode plate group.

As described above, the electrode plate group 10 is composed of the plurality of square-shaped positive electrode plates 18 and negative electrode plates 19 and side edge portions of the electrode plates 18, 19 on the opposite sides are protruded from facing areas of both the electrode plates (see FIGS. 11A and 11B). Then, when the electrode plate group 10 and the current collector 20 are fixed to each other, the lead portions 18a, 19a of the electrode plate group 10 are held by the bent portions 21 in a sandwiched manner. This prevents that the electrode plates 18, 19 spread out of the current collectors 20.

The outer insulating tape 16 is put on the outer surfaces of the positive electrode plate 18 and negative electrode plate 19 between the bent portions 21 to insulate from the battery case 30, as described above, and the current collector 20 including the bent portions 21 is housed in the battery case 30, with the current collector insulating tape 40 therearound as shown in FIG. 1C. The battery case 30 (made of nickel-plated steel plate) has wide side faces, which are substantially parallel to the positive electrode plates 18 and negative electrode plates 19, and narrow side faces, which are faced to the current collector 20, and is negatively charged.

The battery unit having the electrode plate group 10 and current collectors 20 is housed in the battery case 30 and, in such a condition, a short circuit inspection is executed. According to the present embodiment, as shown in FIGS. 1D and 1E, pressure portions 61, 61, which are end portions of a pressing plate 60 having a U-shaped cross section, are attached to the outer faces of the battery case 30 located corresponding to the bent portions 21, 21 to apply pressure to the bent portions 21 of the current collectors 20. Further, while applying the pressure, a short circuit inspection for measuring an insulation resistance is performed by putting a terminal of a short circuit inspection device (MΩ tester) 50 to contact with the terminal portion 20a of the current collector 20 in the positive electrode side, which is connected to the lead portion 18a of the positive electrode plate 18, and the battery case 30.

Figure 10A:
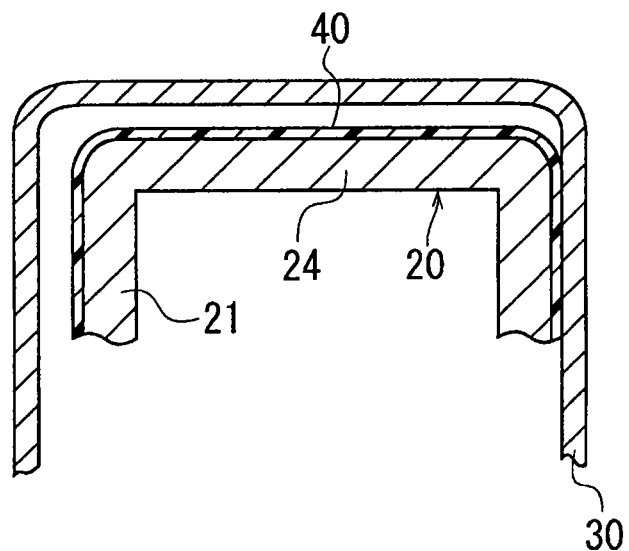
FIGS. 10A and 10B are sectional views showing a relation of a current collectors, a battery case and a spatter in the prismatic battery, with FIG. 10A showing a normal state, and FIG. 10B showing a state, in which a projected object exists on a bent portion.
Figure 10B:
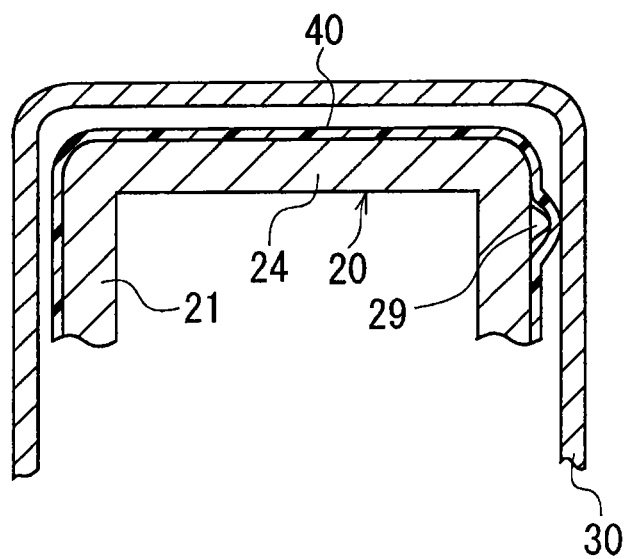

On the bent portions 21 of the current collector 20, a projected object 29 such as a burr can be generated when the current collector 20 is cut in a predetermined size, a spatter can be caused when the current collector 20 is welded to the electrode plate group 10, or a bulge caused by a deteriorated mold for forming the current collector 20 can exist (see FIG. 10B). Such a spatter is likely to be attached on the bent portion 21, particularly in unwelded portions 22, which are in extensions of the welding lines 24a (hereinafter, referred to as welding line correspondent portions 22), since the lead portions 18a, 19a and the lead portion joint surfaces 24 of the current collectors 20 are welded in width direction of the current collector 20.

Existence of such a projected object 29 like a burr and a spatter causes a short circuit during a short circuit inspection since the projected object 29 breaks through the current collector insulating tape 40 when the pressure portions 61 of the pressing plate 60 are attached the outer faces of the battery case 30 and pressure is applied. Accordingly, battery units, which are hardly determined as defective product according to a conventional short circuit inspection method (for example, a technique disclosed in Patent Document 1: Japanese Patent Application Laid-Open No. 2001-236985) can be distinguished as defective products.

The above embodiment shows an example, in which the current collector insulating tape 40 is put on at least the current collector 20 in the positive electrode side. However, the above short circuit inspection can be used when an insulation coating is provided inside of the metallic battery case 30, instead of putting the current collector insulating tape 40 on the current collector 20.

As described above, the short circuit inspection of the present embodiment is executed without applying electrolyte after the battery unit is housed in the battery case 30. However, the short circuit inspection can be executed after housing the battery unit in the battery case 30, and further, applying electrolyte to the battery case 30. With this procedure using the electrolyte, the short circuit inspection can be executed in a condition assuming that the battery case 30 is actually installed in a device, compared to the case without applying the electrolyte.

Further, an activating step for activating the battery is performed after the electrolyte application step, and a module assembling step for assembling a module combining the battery cases 30 as shown in FIG. 2C is performed after the activating step. Then, the short circuit inspection can be implemented on the assembled module. In this case, the module can be assembled prior to the solution applying step and activating step, and then, the short circuit inspection can be executed after the solution applying step and activating step. Here, when the module is assembled and internal resistance values or terminal voltages before and after the inspection are compared during the short circuit inspection step, a part of performance test can be performed at the same time.

Second Embodiment

According to the first embodiment, a short circuit inspection in prismatic battery manufacturing is executed by pressing the bent portions 21 of current collectors 20 to detect a short-circuit failure caused by a projected object 29 generated on the bent portions 21. However, in order to improve yield, preferably, the present invention has not only a structure for detecting a battery unit having a current collector 20 with a projected object 29 as a failure but also a structure for deforming the projected object 29 into a size within a predetermined size before executing the short circuit inspection. With such a structure, a short circuit failure caused by a projected object 29 breaking through the current collector insulating tape 40 can be reduced.

The shape adjusting step can be performed for all bent portions 21 of current collectors 20 regardless of the presence or absence of a projected object 29 or can be performed for only bent portions 21, on which a projected object 29 is detected. Further, in the case that a projected object 29 is detected, the shape adjusting step can be performed only when the height of the projected object 29 excesses an allowable range. Accordingly, in this case, it is required to measure whether or not the height of the projected object 29 is within the allowable range before the shape adjustment. Here, such a measurement can be performed by a measuring device 90, which is generally used for a height confirmation inspection of projected objects 29 after shape adjustment. The details in the measurement method will be described later.

The shape adjusting step is a step for adjusting the shape of the bent portions 21 of the current collectors 20. The shape adjusting step is performed by a current collector shape adjusting device 70 shown in FIGS. 3 to 5C before housing a battery unit having an electrode plate group 10 and current collectors 20 in a battery case 30, and more preferably, before putting the current collector insulating tape 40 to the current collectors 20. The current collector shape adjusting device 70 includes a work placement unit 71, pressing pieces 72, piece fixing plates 73 and a moving mechanism.

Figure 4A:
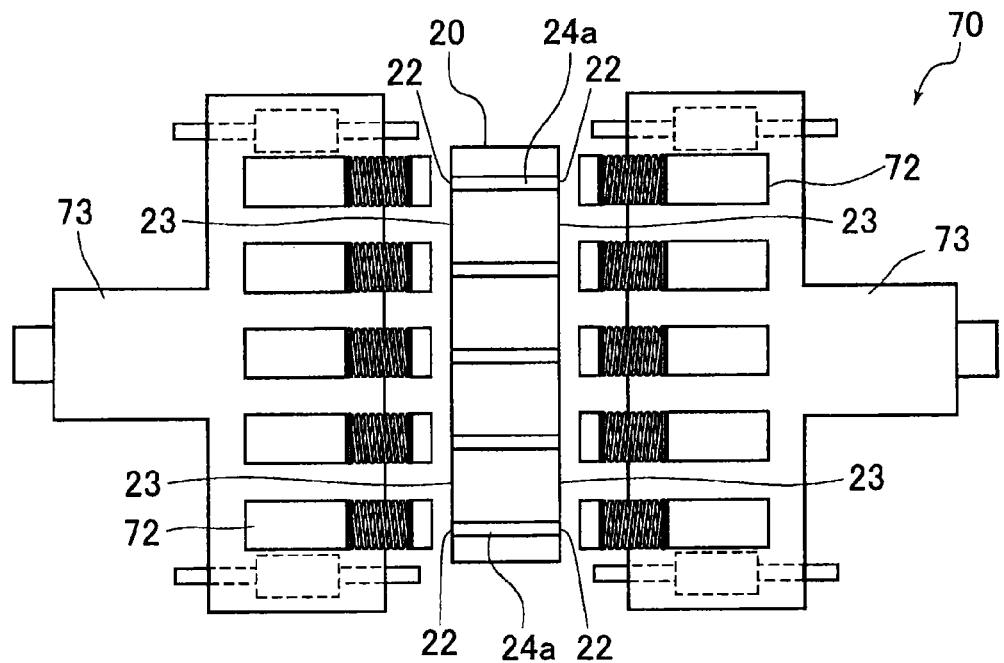
FIG. 4A is a plan view showing the current collector shape adjusting device.
Figure 4B:
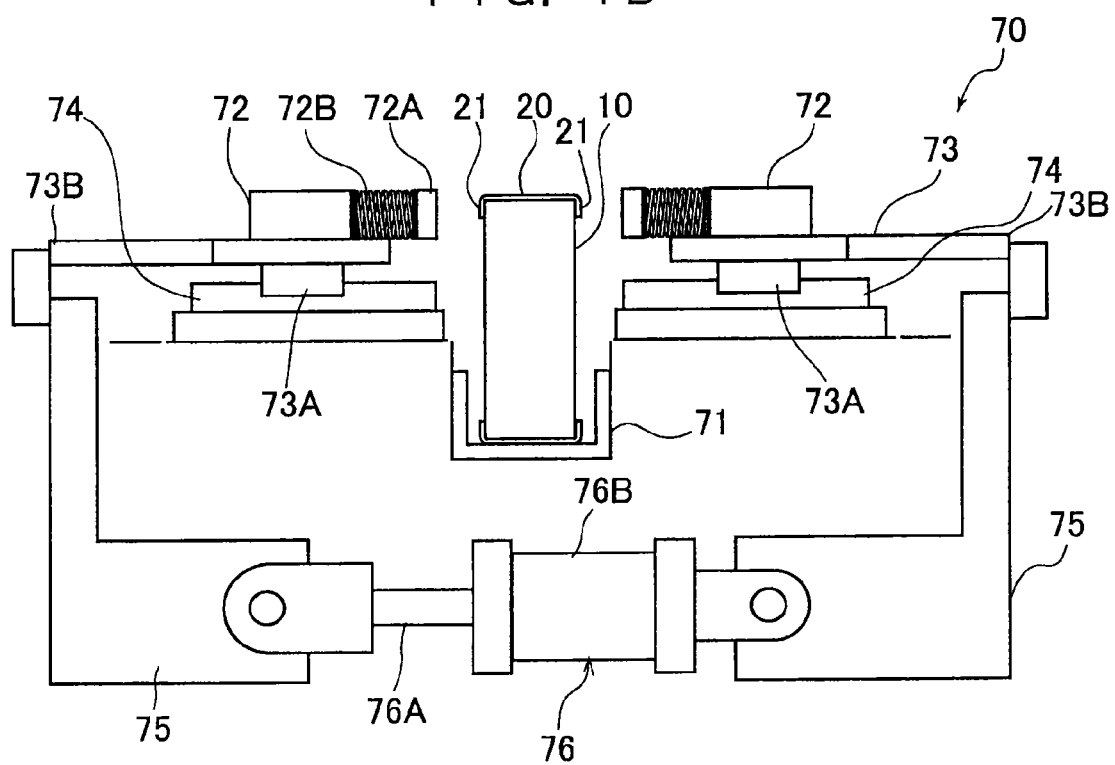
FIG. 4B is a side view of the current collector shape adjusting device.

The work placement unit 71 is formed with a mounting member, to which the battery unit having the electrode plate group 10 with the current collectors 20 is placed. The pressing pieces 72 is provided in both sides of the battery unit in its thickness direction to sandwich the battery unit placed on the work placement unit 71. A plurality of pressing pieces 72 are provided in both sides of the battery unit in its thickness direction in parallel. The number of the pressing pieces 72 to be arranged in parallel is not limited; however, as shown in FIG. 4A, for example, the pressing pieces 72 are respectively provided corresponding to the positions of the welding line correspondent portions 22 on the bent portions 21 of the current collector 20. The pressing pieces 72 can be provided corresponding to adjacent portions 23 on the bent portions 21, which are adjacent to the welding line correspondent portion 22. As described above, a spatter is often attached to the welding line correspondent portions 22 but sometimes attached to the adjacent portions 23. Also, a bulge caused by a deteriorated mold can be generated at the adjacent portions 23, addition to the welding line correspondent portions 22.

The piece fixing plates 73 fix and support the pressing pieces 72 provided in a manner of sandwiching the battery unit (work placement unit 71), and a pair of piece fixing plates 73 are provided in a manner of sandwiching the work placement unit 71. Each of the piece fixing plates 73 is supported by the moving mechanism, and moved, by the moving mechanism, toward the battery unit placed on the work placement unit 71 to press the bent portion 21 with the respective pressing pieces 72. The moving mechanism includes sliders 73A respectively provided on the lower face of the piece fixing plates 73, rails 74 to which each of the sliders 73A are engaged to slide thereon, a pair of pressure arms 75, which are substantially L-shaped and provided corresponding to each of the piece fixing plates 73 to press the rear edges 73B of the piece fixing plates 73 toward the battery unit, and a pressure cylinder 76 having a piston 76A and a cylinder 76B. The piston 76A is connected to one of the pressure arms 75 and the cylinder 76B is connected to the other of the pressure arms 75. The distance between the pressure arms 75, 75 are adjusted by the piston 76A, which moves forwardly and backwardly relative to the cylinder 76B. Accordingly, when both of the pressure arms 75, 75 are moved to be close to each other, each of the pressing pieces 72, 72 supported by the piece fixing plates 73, 73 are moved toward the battery unit (see FIG. 5B).

As shown in FIGS. 4A to 5C, each of the pressing pieces 72 has a head portion 72A made of iron or steel at its end and the head portion 72A is supported by a main body 72C fixed to the piece fixing plate 73 via a spring 72B as an elastic member. Accordingly, as shown in FIG. 5C, when the pressing pieces 72 presses bent portions 21, 21, one of which has a projected object 29, from both sides of the battery unit, the reaction force under the pressure can be adjusted by the springs 72B provided to the pressing pieces 72 facing each other. Thus, the bent portions 21 can be pressed equally from both sides.

An operation of the current collector shape adjusting device 70 will be described. For example, as shown in FIG. 5C, it is assumed that a projected object 29 caused by a spatter is attached on a welding line correspondent portion 22 of the bent portion 21 of the current collector 20. The battery unit having the projected object 29 is placed on the work placement unit 71 and the pressure cylinder 76 is run. Since the pressure cylinder 76 presses the piece fixing plates 73 via the pressure arms 75 toward the battery unit, the pressing pieces 72, 72 fixed to the piece fixing plates 73, 73 apply pressure on the bent portions 21, 21 of the current collector 20 of the battery unit from both sides, as indicated by the imaginary lines in FIG. 5B. With this procedure, the projected object 29 is squashed and deformed. As a result, there is no more projected object 29 or the height of the projected object 29 becomes less than the predetermined size. Accordingly, when a current collector insulating tape 40 is put on the current collector 20, the current collector insulating tape 40 is hardly broken by the projected object 29 and short circuit failures of the current collector 20 and battery case 30 can be suppressed.

Figure 6A:
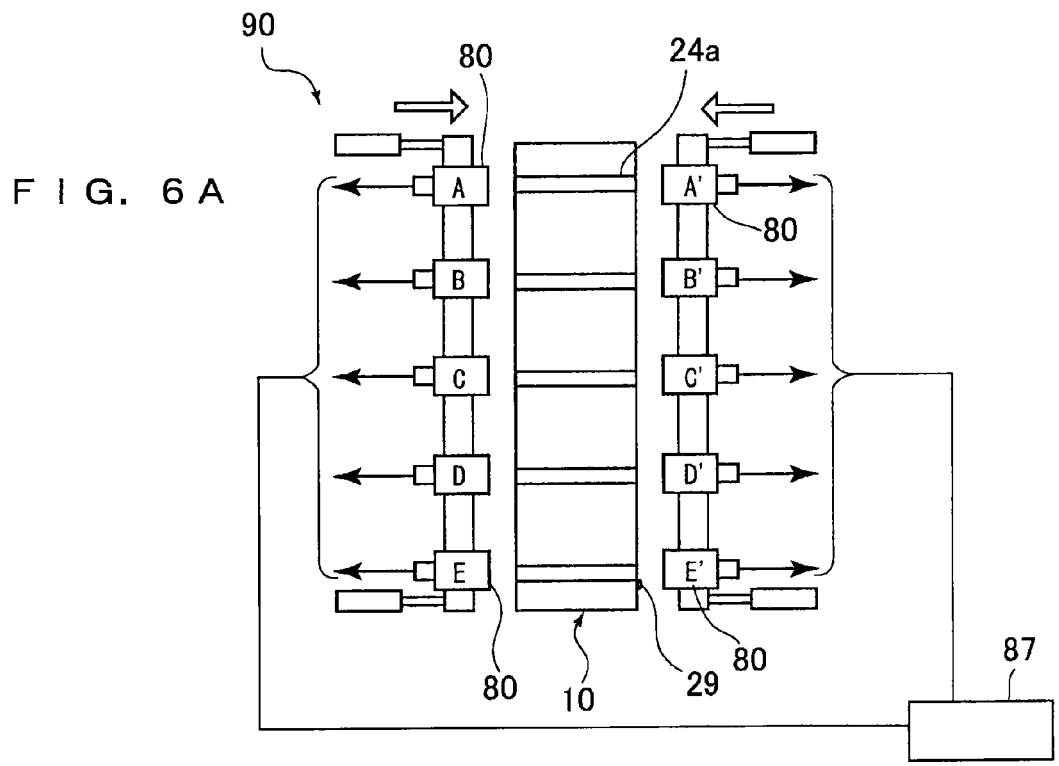
FIGS. 6A and 6B are views used to explain an outline of a measuring device.
Figure 6B:
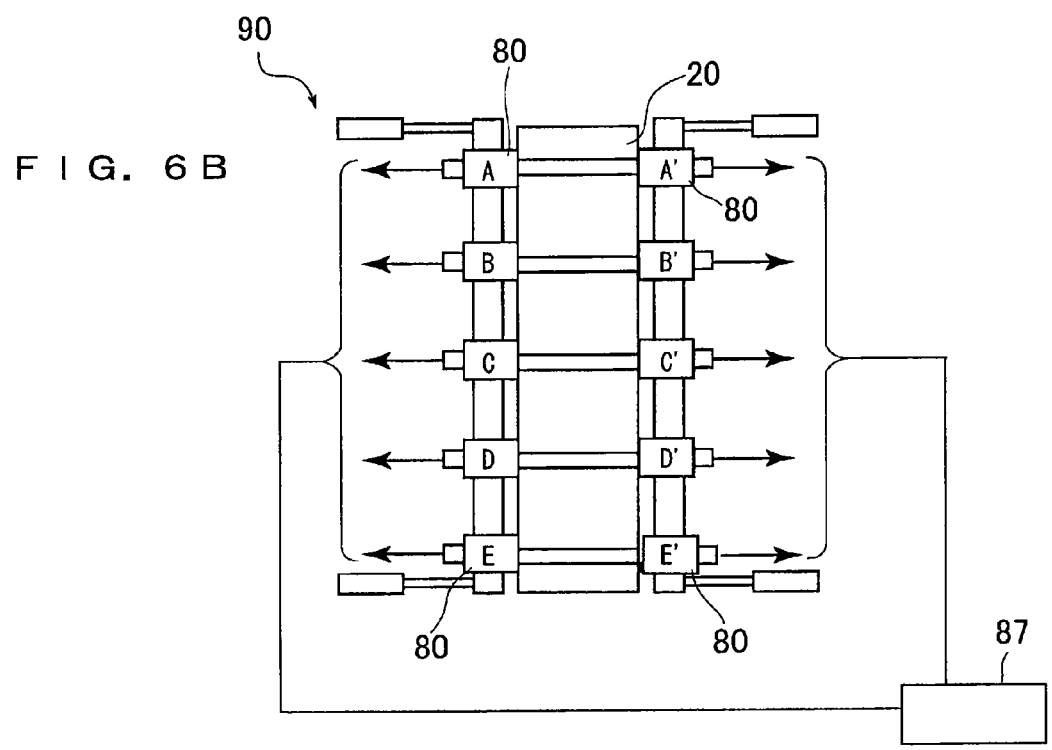

After the shapes of the bent portions 21 of the current collector 20 are adjusted by the current collector shape adjusting device 70, an inspection is executed to check whether or not a projected object 29, which excess the allowable range, remains on the shape-adjusted bent portions 21. This inspection is executed by measuring the height of projected objects 29 on the bent portion 21. The height of projected object 29 is measured by the measuring device 90 shown in FIGS. 6A and 6B. The measuring device 90 has a placement unit (not shown) for placing the battery unit having the electrode plate group 10 and current collector 20 and dimension measuring devices 80 are provided in a manner of sandwiching the placement unit. As shown in FIGS. 6A and 6B, the dimension measuring devices 80 are provided in positions indicated by A to E and A' to E' in both sides of the battery unit, corresponding to the five welding line correspondent portions 22 in one side (that is, ten positions in both sides) on the bent portions 21 of the current collector 20. Further, data measured by the respective dimension measuring devices 80 are sent to a determination device 87 to determine whether or not a projected object 29 still exists and, when exists, whether or not the height of the projected object 29 is included the allowable range.

Figure 7A:
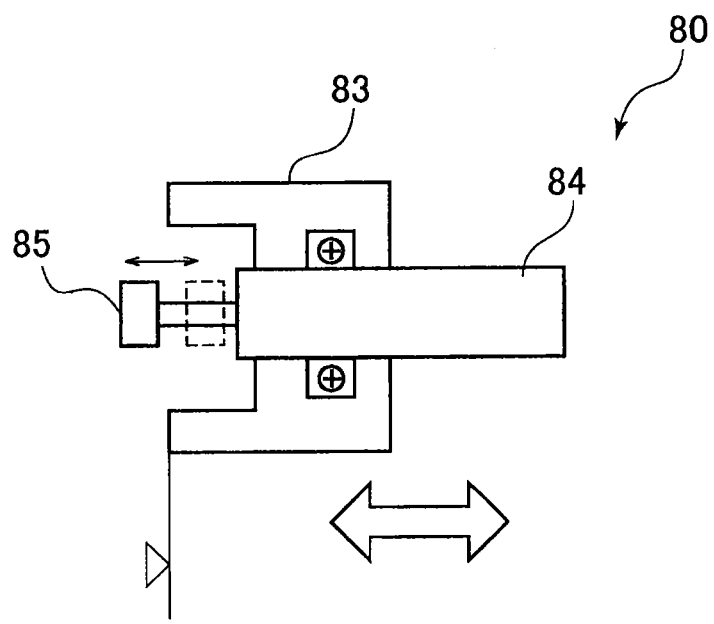
FIG. 7A is a plan view showing a dimension measuring device used in a measuring device.
Figure 7B:
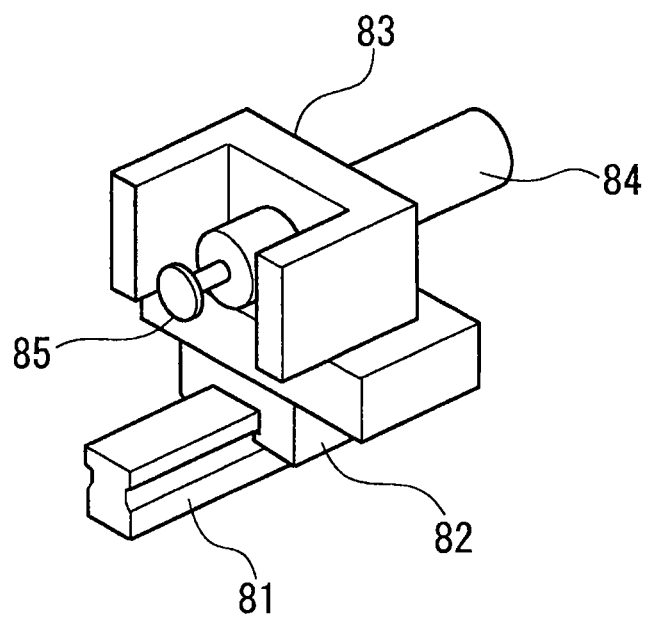
FIG. 7B is a perspective view of the dimension measuring device.

As shown in FIGS. 7A and 7B, each of the respective dimension measuring devices 80 includes a slider 82 slidable along a rail member 81, a block 83, which has a U-shaped horizontal cross section and fixed to the slider 82, a cylindrical measuring base 84 housed in an opening of the block 83 and a measuring head 85, which is extendable from the opening of the block 83 in an axial direction of the cylinder of the measuring base 84 and moves forward and backward in the axial direction of the measuring base 84.

The dimension measuring devices 80 in the positions indicated by A to E and A' to E' move toward each other along the rail member 81 (not shown in FIGS. 6A and 6B), as from the state shown in FIG. 6A to the state shown in FIG. 6B. The dimension measuring devices 80 stop moving when being close to the bent portion 21 in some level. Then, the measurements of the respective welding line correspondent portions 22 are performed by the respective dimension measuring devices 80 in the positions A to E and A' to E'. Here, since this movement is only an example, the devices 80 in the positions A to E and the devices 80 in positions A' to E' do not have to move together and can move separately.

Figure 8A:
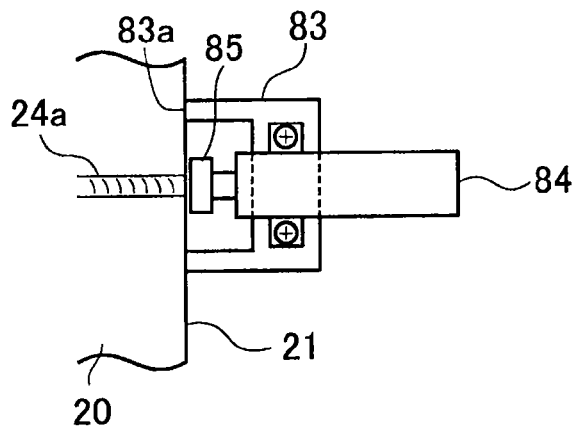
FIGS. 8A to 8C are plan views showing usage states of the dimension measuring device.
Figure 9A:
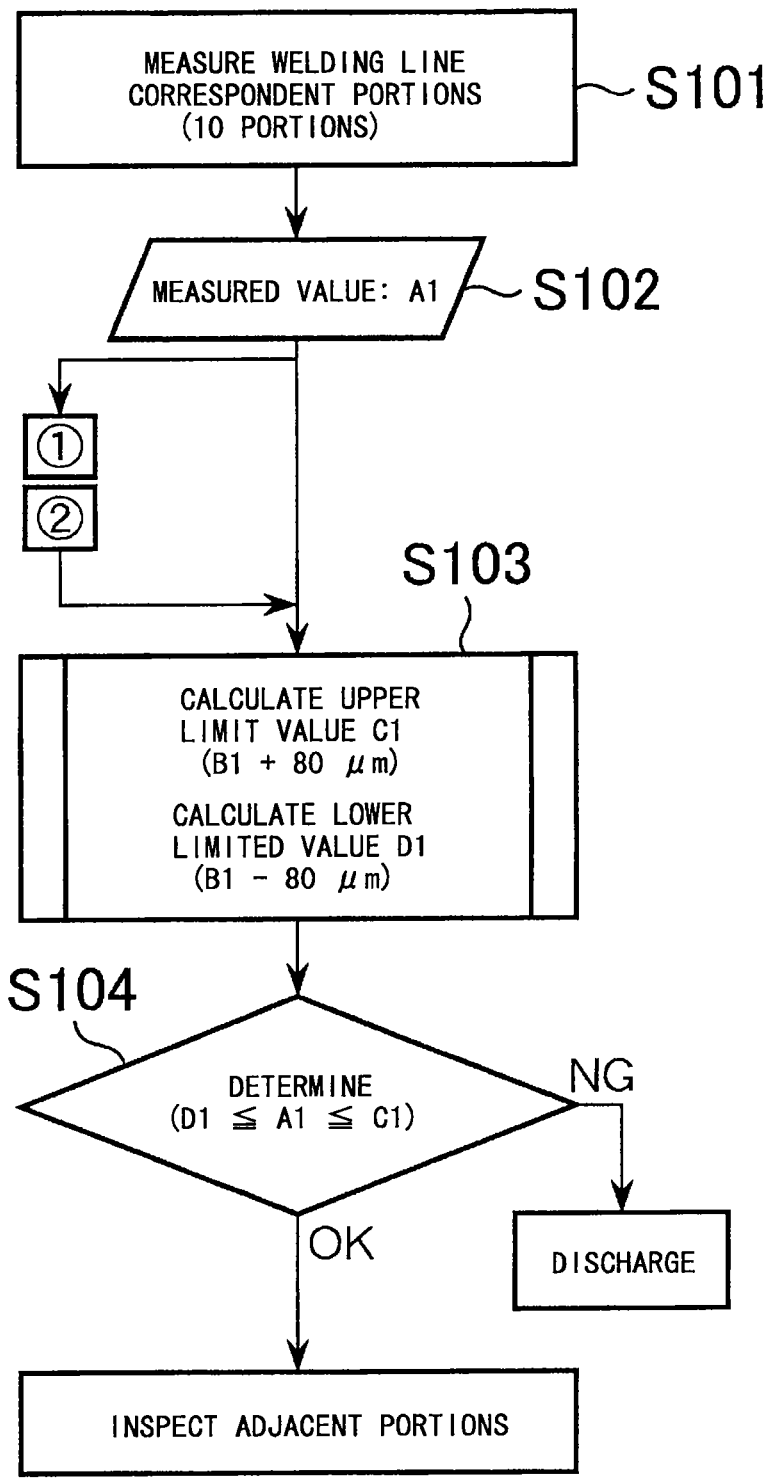
FIGS. 9A to 9C are flowcharts to explain a height determination step in a determination device, which receives a measuring result from the dimension measuring device.
Figure 9B:
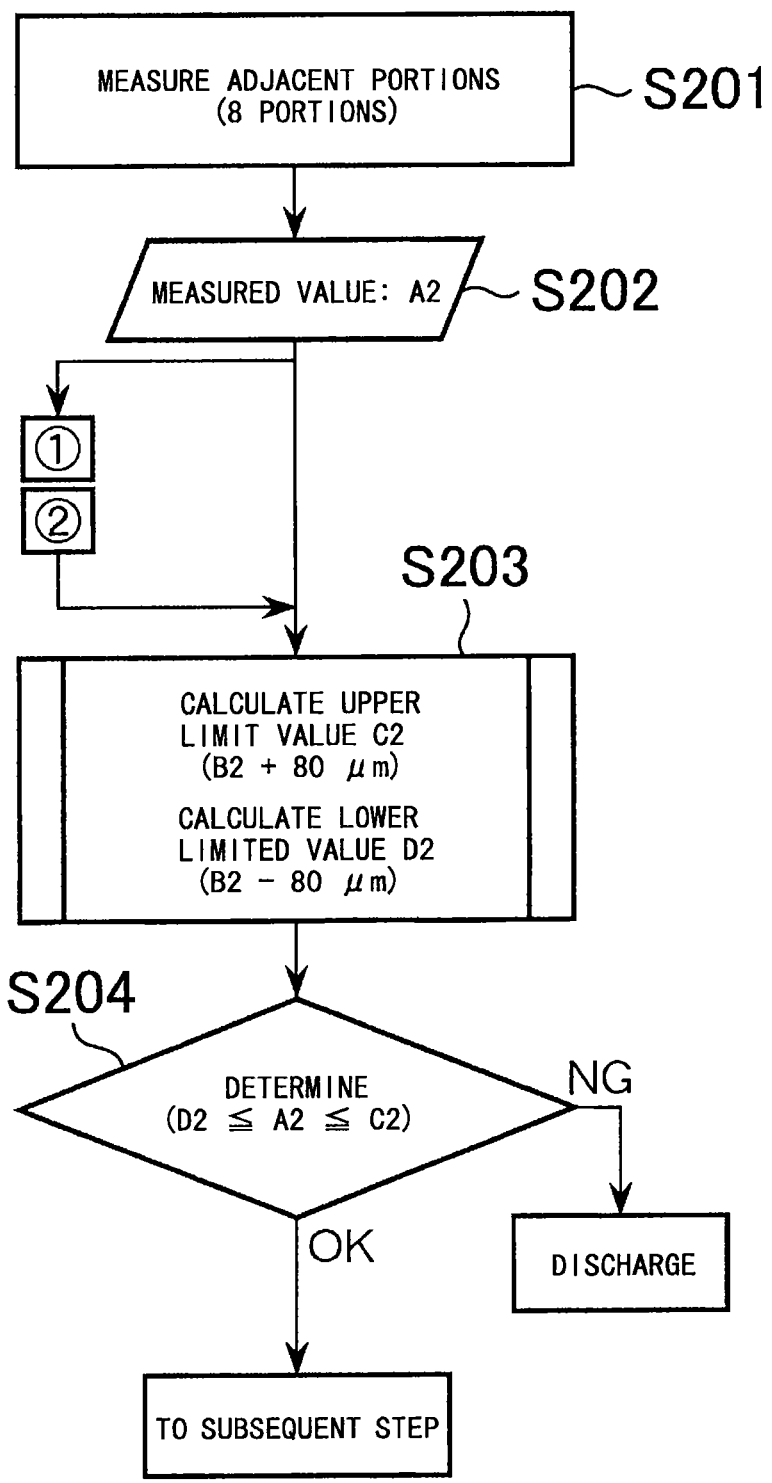
Figure 9C:
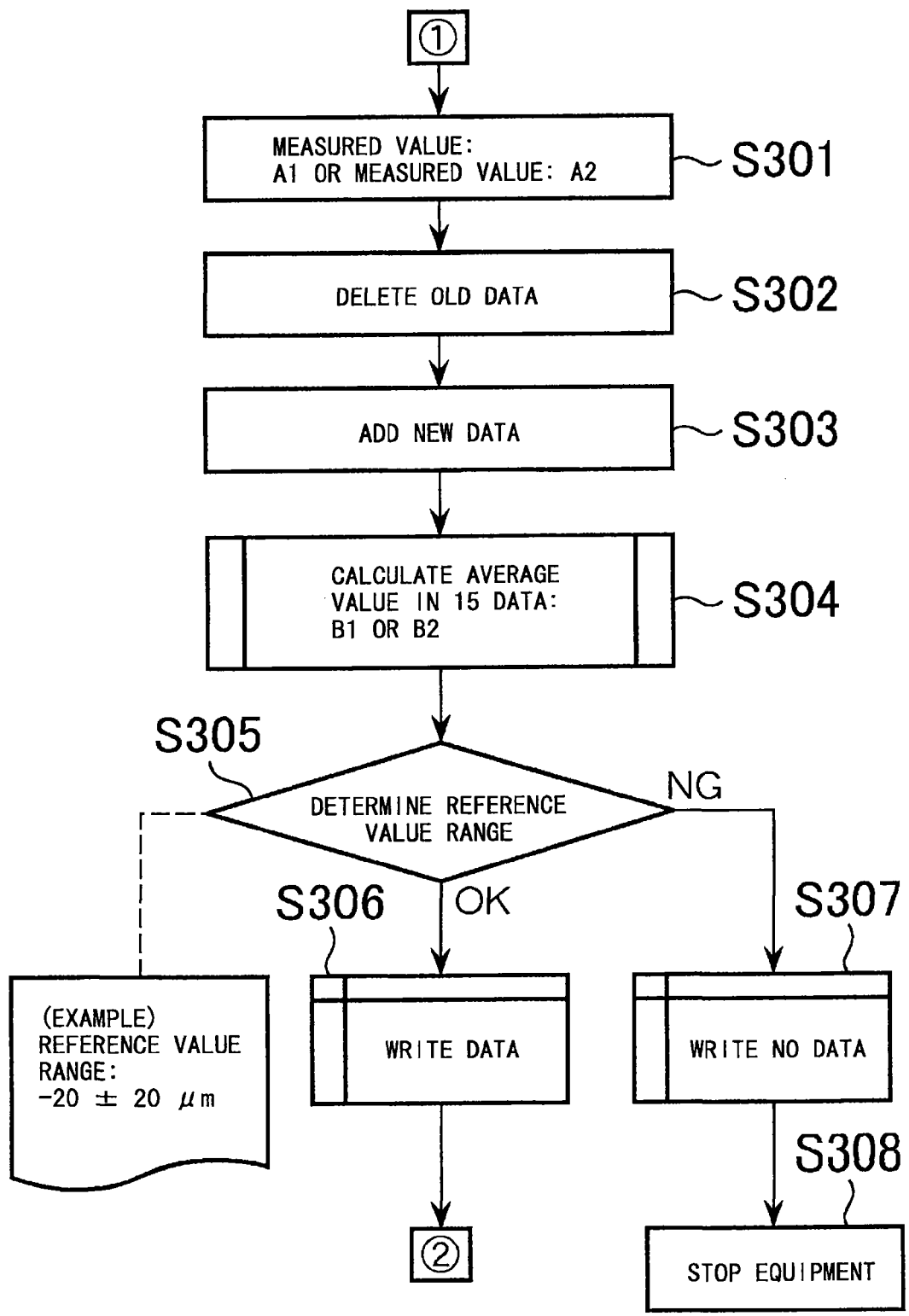

As described above, when the dimension measuring devices 80 are moved close to the bent portions 21, front end surfaces 83a of the block 83 are attached to both sides of the welding line correspondent portion 22 of the bent portion 21, as shown in FIG. 8A. Then, the measuring head 85 is operated. As shown in FIG. 8A, when there is no projected object 29 such as a burr or a spatter, the measuring head 85 projects to the same level of the front end surfaces 83a of the block 83 and stops moving. That is, there is no difference in the levels of the attachment surface of the measuring head 85 and the front end surfaces 83a of the block 83. This data is sent to the determination device 87; however, since the difference is "0," it is determined that the height of a projected object 29 in the measured portion is within the allowable range, or that there is no projected object 29 in the portion.

Figure 8B:
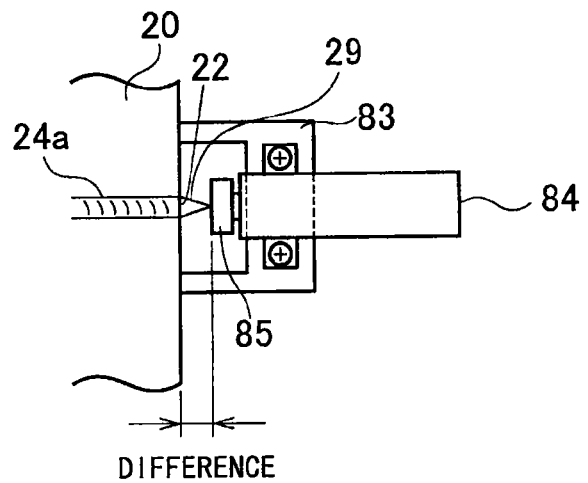

On the other hand, as shown in FIG. 8B, when a projected object 29 is formed by a spatter on the bent portion 21 of the welding line correspondent portion 22 of the current collector 20, the measuring head 85 contacts with the projected object 29 made of a spatter and cannot project to the same level of the front end surfaces 83a of the block 83. Accordingly, a difference is generated between the levels of the measuring head 85 and the front end surfaces 83a. The difference in the levels is sent to the determination device 87 to determine whether or not the difference is within the allowable range. The procedure proceeds to a following step only when the difference is within the allowable range. When the difference excesses the allowable range, the battery unit is discarded, or the shape adjustment by the current collector shape adjusting device 70 for the current collector 20 can be repeated until the difference becomes the level of the allowable range.

Figure 8C:
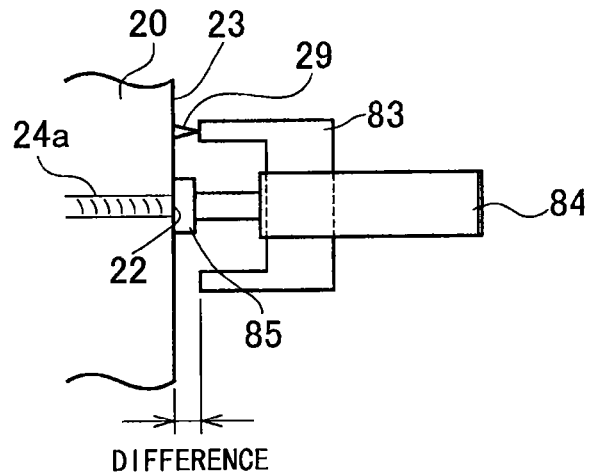

FIG. 8C shows a case that a projected object 29 exists on the adjacent portion 23 adjacent to the welding line correspondent portion 22 on the bent portion 21. On the adjacent portion 23, also, a spatter generated during a welding process can be attached, a burr remains, or a bulge caused by an age-deteriorated mold for manufacturing the current collector 20 can be generated. When such a projected object 29 exits on the adjacent portion 23, the front end surface 83a of the block 83 contact with the projected object 29 on the adjacent portion 23. Accordingly, a difference between the front end surface 83a and the measuring head 85 is generated and the determination device 87 determines whether or not the difference is within the allowable range.

Although the projected object 29 on the adjacent portion 23 can be measured as shown in FIG. 8C, if the block 83, measuring base 84 and measuring head 85 are movable in a direction orthogonal to the rail member 81, the measuring head 85 is attached to the projected object 29 on the adjacent portion 23 and the distance between the measuring head 85 and the front end surface 83a of the block 83 can be measured, similar to the case of FIG. 8B. Further, a set of the five dimension measuring devices 80 in the positions A to E and a corresponding set of the five dimension measuring devices 80 in the positions A' to E' in FIGS. 6A and 6B can be made movable in a direction orthogonal to the direction moving toward the battery unit to measure the height of the projected object 29 on the adjacent portion 23.

A height determination step of the determination device 87, which receives measurement results from the dimension measuring devices 80, will be described with reference to FIGS. 9A to 9C. Firstly, the height of the projected object 29 on the welding line correspondent portion 22 of the bent portion 21 is measured. For example, as shown in FIGS. 6A and 6B, the measurement is performed on the ten welding line correspondent portions 22 (S101) and, among the measurements, the measured value from the dimension measuring device 80 in the position E' is referred to as A1 (S102). The measured value A1 is relevant to the difference in the levels of the measuring head 85 and the front end surface 83a of the block 83, shown in FIG. 8B. When the measured value A1 is simply applied and, for example, the value A1 is between a predetermined upper limited value and a predetermined lower limited value, it is determined that the height is within the allowable range. In this case, when the bent portions 21 are formed completely the same in every battery unit, it is not a case to be concerned. However, the measured value A1 is the difference in levels of the measuring head 85 and the front end surfaces 83a of the block 83, that is, a relative displacement amount thereof. The bent portion 21 itself can have irregularities and deformations on its surface caused by an age-deteriorated mold for manufacturing current collectors 20, regardless of projected objects 29. In this case, when a projected object 29 of one battery unit and a projected object 29 on another battery unit are compared, the measured values A1 as relative displacement amounts between the measuring head 85 and the front end surface 83a of the block 83 can be differ in every battery unit even if the heights of the projected object 29 itself are the same. Thus, when the upper limited value and lower limited value of the allowable range are determined without variations, this can reduce the accuracy of determination results.

Accordingly, a shown in FIG. 9C, it is preferable to obtain an average value by averaging the measured values at the welding line correspondent portions 22 more than once and to determine whether or not the measured value A1 is within the allowable range, with respect to the average value. The number of averaging can be arbitrarily determined; however, when a measured value, for example, a measured value A1, is newly obtained, it is preferable to calculate an average value including the newly obtained measured value A1. Concretely, assuming that the number of averaging is 15, when the measured value A1 is newly obtained (S301), the oldest data among the former 15 values is deleted (S302), the new measured value A1 is added (S303), and an average value B1 in the new 15 values is calculated (S304). Then, as shown in S103 in FIG. 9A, with respect to the average value B1, an upper limited value C1 (for example, B1+80 μm) and a lower limited value D1 (for example, B1−80 μm) are obtained, an allowable range is determined, and then, it is determined the measured value A1 is within the allowable range (S104). When the measured value A1 is within the allowable range, the procedure proceeds to an inspection step of the adjacent portions 23. When the measured value A1 is out of the allowable range, the unit is discharged as a defective product.

On the other hand, since an age-deteriorated mold remarkably reduce the accuracy of forming bent portion 21 in some cases, the average value B1 calculated by including a new measured value can be increased or decreased, compared to a former obtained average value B1. Accordingly, as shown in S305 in FIG. 9C, it is determined whether or not the newly calculated average value B1 is within a predetermined reference value range and, when it is out of the reference value range, it is preferable not to accept the battery unit. To determine the reference value range, some battery units are previously measured and an average value B1 and its standard deviation .sigma. is obtained. Further, when a new average value based on the new measured value is obtained, its standard deviation σ can be newly obtained to update the reference value range sequentially (S306). Then, when it is confirmed that the new average value B1 is included in the reference value range, the procedure proceeds to S103 in FIG. 9A. Here, when the average value B1 is out of the reference value range, since the deformation of the current collector 20 is remarkable, an action such as stopping the equipment or the like is taken without calculating a new reference value range (S307, S308).

In S104 of FIG. 9A, when measured values for all the welding line correspondent portions 22 are included in the allowable range, the dimension measuring device 80 measures heights of projected objects 29 on the adjacent portions 23 (in the example of FIGS. 6A and 6B, the eight positions between the welding line correspondent portions 22) (S201). Accordingly, for example, when a measured value A2 is obtained (S202), the steps of S301 to S305 in FIG. 9C are performed using the measured value A2, similar to the case of measured value A1 at the welding line correspondent portion 22 to obtain an average value B2 for projected objects on the adjacent portions 23 and to determine whether the average value B2 is within the reference value range. When the average value B2 is obtained and the average value B2 is included in the reference value range, an upper limited value C2 (for example, B2+80 μm) and a lower limited value D2 (for example, B2−80 μm) are calculated (S203) and it is determined whether or not the measured value A2 is included in a range between the upper limited value C2 and lower limited value D2 (S204). When the measured value A2 is within the allowable range, the procedure proceed a sequential step to put a current collector insulating tape 40 thereon or house the battery unit into a battery case 30 and the like. When the measured value A2 is out of the allowable range, the battery unit is discharged as a defective product.

INDUSTRIAL APPLICABILITY

The present invention is mainly applicable to fields of manufacturing prismatic batteries and inspecting prismatic batteries. As a secondary battery, the present invention can be applied to a lithium-ion battery, nickel-metal hydride battery and the like. Further, the present invention is applied to a primary battery that is a prismatic battery.

What is claimed is:

1. A current collector shape adjusting device squashing a projected object on bent portions of current collectors of a battery unit before housing the battery unit in a metallic battery case of a prismatic battery, the battery unit comprising:

an electrode plate group composed of a plurality of square-shaped positive electrode plates and negative electrode plates stacked via separators in which side edge portions of the electrode plates on the opposite sides are protruded from facing areas of both the electrode plates; and the current collectors having lead portion joint surfaces, which are respectively provided corresponding to lead portions of positive electrode plates and negative electrode plates in sides of the electrode plate group, face to end portions of the lead portions, and have at least a part to be welded and fixed to the lead portions, and bent portions bend from both side edges of respective lead portion joint surfaces to lie over outer surfaces of the electrode plate group in a stack direction of the positive electrode plates and the negative electrode plates, and the current collector shape adjusting device comprising:

a work placement unit on which the battery unit is placed;

a pair of pressing pieces provided in both sides of the battery unit in a thickness direction to squash and deform, in the thickness direction, a projected object on the bent portions of the current collectors of the battery unit disposed on said work placement unit;

a pair of piece fixing plates fixing and supporting said respective pressing pieces; and a moving mechanism moving said pair of piece fixing plates and pressing pieces toward the battery unit placed on said work placement unit, wherein each of said pressing pieces comprises a head portion made of iron or steel contacting with the bent portion of the current collector, a main body fixed to said piece fixing plate, and a spring disposed between the head portion and the main body, wherein said pressing pieces are respectively provided corresponding to welding line correspondent portions on the bent portions, which are in extensions of welding lines on lead portion joint surfaces, of the current collectors, wherein said moving mechanism includes a pair of pressure arms, which are provided corresponding to each of the piece fixing plates to press the piece fixing plates toward the battery unit, and a pressure cylinder having a piston which is connected to one of the pressure arms and a cylinder which is connected to the other of the pressure arms, and wherein a distance between the pressure arms is adjusted by the piston, which moves forward and backward relative to the cylinder, and when both of the pressure arms are moved to be close to each other, each of the pressing pieces supported by the piece fixing plates are moved toward the battery unit.

* * * * *